(12) United States Patent
van den Brand et al.

(10) Patent No.: US 10,717,236 B2
(45) Date of Patent: Jul. 21, 2020

(54) CURING A HEAT-CURABLE MATERIAL IN AN EMBEDDED CURING ZONE

(71) Applicants: Nederlandse Organisatie voor toegepast-natuurwetenschappelijk onderzoek TNO, 's-Gravenhage (NL); Henkel AG & Co. KGaA, Dusseldorf (DE)

(72) Inventors: Jeroen van den Brand, 's-Gravenhage (NL); Ashok Sridhar, 's-Gravenhage (NL); Anja Henckens, Zonhoven (BE); Gunther Dreezen, Balen-Olmen (BE)

(73) Assignee: NEDERLANDSE ORGANISATIE VOOR TOEGEPAST-NATUURWETENSCHAPPELIJK ONDERZOEK TNO, 's-Gravenhage (NL)

( * ) Notice: Subject to any disclaimer, the term of this patent is extended or adjusted under 35 U.S.C. 154(b) by 428 days.

(21) Appl. No.: 14/650,084

(22) PCT Filed: Dec. 17, 2013

(86) PCT No.: PCT/NL2013/050905
§ 371 (c)(1),
(2) Date: Jun. 5, 2015

(87) PCT Pub. No.: WO2014/098577
PCT Pub. Date: Jun. 26, 2014

(65) Prior Publication Data
US 2015/0367560 A1    Dec. 24, 2015

(30) Foreign Application Priority Data
Dec. 18, 2012  (EP) ..................................... 12197647

(51) Int. Cl.
*B29C 65/14* (2006.01)
*H01L 23/00* (2006.01)
(Continued)

(52) U.S. Cl.
CPC ........ *B29C 65/1403* (2013.01); *B29C 65/221* (2013.01); *B29C 65/245* (2013.01);
(Continued)

(58) Field of Classification Search
CPC . B29C 65/1403; B29C 65/221; B29C 65/245; B29C 65/4835
See application file for complete search history.

(56) References Cited

U.S. PATENT DOCUMENTS 6,179,679 B1    1/2001  von Gutfeld et al.
7,829,248 B2 *  11/2010  Lin ........................... G03F 1/64
                                                      430/311
(Continued)

FOREIGN PATENT DOCUMENTS

CN    1295311    5/2001
EP    0758145 A2    2/1997
(Continued)

OTHER PUBLICATIONS

Machine Translation of JP-2005129835-A (Year: 2005).*
(Continued)

*Primary Examiner* — Daniel McNally
(74) *Attorney, Agent, or Firm* — Hoffmann & Baron, LLP (57) ABSTRACT

The present disclosure relates to a method for curing a heat-curable material (1) in an embedded curing zone (2) and an assembly resulting from such method. The method comprises providing a heat-conducting strip (3) partially arranged between a component (9) and a substrate (10) that form the embedded curing zone (2) therein between. The heat-conducting strip (3) extends from the embedded curing
(Continued)

zone (2) to a radiation-accessible zone (7) that is distanced from the embedded curing zone (2) and at least partially free of the component (9) and the substrate (10). The method further comprises irradiating the heat-conducting strip (3) in the radiation-accessible zone (7) by means of electromagnetic radiation (6). Heat (4a) generated by absorption of the electromagnetic radiation (6) in the heat-conducting strip (3) is conducted from the radiation-accessible zone (7) along a length of the heat-conducting strip (3) to the embedded curing zone (2) to cure the heat-curable material (1) by conducted heat (4b) emanating from the heat-conducting strip (3) into the embedded curing zone (2).

13 Claims, 8 Drawing Sheets

(51) Int. Cl.
| | | |
|---|---|---|
| *B29C 65/22* | (2006.01) | |
| *B29C 65/24* | (2006.01) | |
| *B29C 65/48* | (2006.01) | |
| *H05B 3/00* | (2006.01) | |
| *B29K 101/10* | (2006.01) | |
| *B29L 9/00* | (2006.01) | |

(52) U.S. Cl.
CPC .......... *B29C 65/4835* (2013.01); *H01L 24/29* (2013.01); *H01L 24/83* (2013.01); *H05B 3/0038* (2013.01); *B29K 2101/10* (2013.01); *B29L 2009/00* (2013.01); *H01L 24/81* (2013.01); *H01L 2224/16225* (2013.01); *H01L 2224/2929* (2013.01); *H01L 2224/29309* (2013.01); *H01L 2224/29311* (2013.01); *H01L 2224/29313* (2013.01); *H01L 2224/29339* (2013.01); *H01L 2224/29344* (2013.01); *H01L 2224/29347* (2013.01); *H01L 2224/29364* (2013.01); *H01L 2224/29369* (2013.01); *H01L 2224/29386* (2013.01); *H01L 2224/29388* (2013.01); *H01L 2224/29393* (2013.01); *H01L 2224/29439* (2013.01); *H01L 2224/29499* (2013.01); *H01L 2224/32145* (2013.01); *H01L 2224/32225* (2013.01); *H01L 2224/73204* (2013.01); *H01L 2224/75283* (2013.01); *H01L 2224/81191* (2013.01); *H01L 2224/81903* (2013.01); *H01L 2224/83007* (2013.01); *H01L 2224/8322* (2013.01); *H01L 2224/8323* (2013.01); *H01L 2224/83224* (2013.01); *H01L 2224/83862* (2013.01); *H01L 2224/83868* (2013.01); *H01L 2224/83871* (2013.01); *H01L 2224/83874* (2013.01); *H01L 2924/12042* (2013.01); *Y10T 428/24752* (2015.01)

(56) References Cited

U.S. PATENT DOCUMENTS

| | | | |
|---|---|---|---|
| 2003/0162463 | A1 | 8/2003 | Hayashi et al. |
| 2005/0085053 | A1* | 4/2005 | Chen ................. H01L 23/26 438/471 |
| 2011/0061884 | A1* | 3/2011 | Wang ................. B23K 26/0604 174/50.5 |
| 2012/0040128 | A1* | 2/2012 | Finn ................. G06K 19/07783 428/96 |

FOREIGN PATENT DOCUMENTS

| | | | | |
|---|---|---|---|---|
| EP | 1093880 | A1 * | 4/2001 | ........... B23K 1/0056 |
| EP | 2349727 | | 8/2011 | |
| JP | 63265424 | A | 11/1988 | |
| JP | 09-051016 | | 2/1997 | |
| JP | 2001044241 | A * | 2/2001 | ............. H01L 24/29 |
| JP | 2001044241 | A | 2/2001 | |
| JP | 2003218281 | A | 7/2003 | |
| JP | 2005-129835 | A | 5/2005 | |
| JP | 2005129835 | A * | 5/2005 | |
| JP | 2008085287 | A | 4/2008 | |
| JP | 2010-177235 | A | 8/2010 | |
| JP | 2010177235 | A * | 8/2010 | |
| JP | 5132275 | A | 6/2015 | |
| WO | WO2006126015 | A1 | 11/2006 | |
| WO | WO2010036116 | A1 | 4/2010 | |

OTHER PUBLICATIONS

Machine Translation of JP-2001044241-A (Year: 2001).*
Machine Translation of JP-2010177235-A (Year: 2010).*
Machine Translation of EP-1093880-A1 (Year: 2001).*
Elsevier Butterworth-Heinemann, "Chapter 4: Material property charges ED—Ashby M F," pp. 45-78, 2005.

* cited by examiner

CURING A HEAT-CURABLE MATERIAL IN AN EMBEDDED CURING ZONE

This application is the U.S. National Phase of, and Applicants claim priority from, International Patent Application Number PCT/NL2013/050905 filed Dec. 17, 2013, which claims priority from EP 12197647.6 filed Dec. 18, 2012, each of which is incorporated herein by reference.

FIELD AND BACKGROUND

The present disclosure relates to a method for curing a heat-curable material in an embedded curing zone. The disclosure further relates to a method for using a curing system. The disclosure further relates to an assembly comprising a substrate and a component adhered to the substrate by means of a heat-curable material formed in an embedded curing zone between the component and the substrate.

A heat-curable material is typically cured by means of heating the material, e.g. above a curing temperature and/or during a curing period. Curing typically involves a transition such as hardening of a material, e.g. due to molecular cross-linking. The curing zone is a target area or volume wherein the heat-curable material is localized to be cured for performing its functionality, e.g. adhering surfaces together. The term "embedded" as in "embedded curing zone" may refer to an at least partial encapsulation of the curing zone, e.g. the curing zone is buried within an assembly comprising obstructions such as components and/or substrates surrounding the curing zone.

An embedded curing zone may be generally difficult to access for an external heating source such as a lamp or laser. One solution, described e.g. in US2003/0162463 or WO2006/126015, may be to provide a radiation-transparent substrate and irradiate the curing zone through the substrate. However, this is only suitable when the embedded curing zone is accessible to electromagnetic radiation. Another solution, described e.g. in JP2003218281, may be to provide an internal heating source, by burying a resistance wire next to the curing zone and selectively applying an electrical current to the wire for heating it. JP2008-085287 describes a heating circuit next to a connection member. However, this may require additional circuitry and/or the electrical current may be harmful to nearby electronic components. JP 2001-044241 describes applying heat and/or electromagnetic waves to an IC chip with a bonding layer while pressing the chip on to a circuit formed on a substrate. However, heating the IC chip may be harmful to its functioning. One solution to provide a desired curing temperature at an embedded curing zone under general circumstances may be to heat the entire assembly, e.g. by baking the assembly in an oven. However, such indiscriminate heating may be energy inefficient and/or harmful to heat-sensitive components that may be part of the assembly.

There is a desire for a more versatile method of curing a heat-curable material in an embedded curing zone.

SUMMARY

In a first aspect there is provided a method for curing a heat-curable material in an embedded curing zone. The method comprises providing a heat-conducting strip partially arranged between obstructions that form the embedded curing zone therein between. The heat-conducting strip extends from the embedded curing zone to a radiation-accessible zone that is distanced from the embedded curing zone and at least partially free of the obstructions. The method further comprises irradiating the heat-conducting strip in the radiation-accessible zone by means of electromagnetic radiation. Heat generated by absorption of the electromagnetic radiation in the heat-conducting strip is conducted from the radiation-accessible zone along a length of the heat-conducting strip to the embedded curing zone to cure the heat-curable material by conducted heat emanating from the heat-conducting strip into the embedded curing zone.

A heat conducting strip extending between the embedded curing zone and a radiation-accessible zone may allow heating of the curing zone by means of electromagnetic radiation even when the curing zone is not accessible to direct irradiation. Because heat is generated by absorption of electromagnetic radiation, the method does not require application of electrical currents near possibly sensitive circuitry. By using a heat-conducting strip to conduct heat to the curing zone instead of irradiating the chip itself, e.g. according to JP2001-044241, excessive heating of the chip can be prevented. Electromagnetic radiation can be targeted to the strip in the radiation accessible zone which may be more efficient than heating an entire assembly. There is thus provided a method of curing of a heat-curable material in an embedded curing zone that is more versatile, e.g. providing energy efficiency while being adaptable to different circumstances such as opaque surfaces enclosing a curing zone and/or sensitive circuitry. It will further be appreciated that the provision of a heat-conducting strip may be incorporated into an existing design and/or manufacturing workflow.

In a second aspect there is provided a method for using a curing system, the system comprising a radiation source. The method comprises providing the system with a substrate comprising a heat-conducting strip partially arranged between the substrate and a component on the substrate, the component and substrate forming an embedded curing zone therein between, the heat-conducting strip extending from the embedded curing zone to a radiation-accessible zone that is distanced from the embedded curing zone and at least partially free of the component or substrate. The method further comprises controlling the system for irradiating the heat-conducting strip in the radiation-accessible zone by means of electromagnetic radiation emanating from the radiation source. Heat generated by absorption of the electromagnetic radiation in the heat-conducting strip is conducted from the radiation-accessible zone along a length of the heat-conducting strip to the embedded curing zone to cure the heat-curable material by conducted heat emanating from the heat-conducting strip into the embedded curing zone.

The method according to the second aspect may provide similar advantages as the method according to the first aspect while using a general purpose or dedicated curing system comprising a radiation source.

In a third aspect there is provided an assembly comprising a substrate and a component adhered to the substrate by means of a heat-curable material formed in an embedded curing zone between the component and the substrate; wherein a heat-conducting strip is partially arranged between the substrate and component, the heat-conducting strip extending from the embedded curing zone to a radiation-accessible zone that is distanced from the embedded curing zone and at least partially free of the substrate or component; wherein the heat-curable material is cured by conducted heat emanated from the heat-conducting strip into the embedded curing zone.

The assembly according to the third aspect may e.g. result from methods according to the first or second aspects.

BRIEF DESCRIPTION OF THE DRAWINGS

These and other features, aspects, and advantages of the apparatus, systems and methods of the present disclosure will become better understood from the following description, appended claims, and accompanying drawing wherein:

DETAILED DESCRIPTION

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be further understood that the terms "comprises" and/or "comprising" specify the presence of stated features but do not preclude the presence or addition of one or more other features. All publications, patent applications, patents, and other references mentioned herein are incorporated by reference in their entirety. In case of conflict, the present specification, including definitions, will control.

The term "heat-curable", as used in the present invention, refers to any material which is chemically and/or physically curable when being exposed to heat. The term "chemically curable" refers to any material that undergoes a chemical curing or cross-linking reaction when being exposed to heat. The term "physically curable" refers to any material which is capable of solidifying in a drying process in the presence of heat through loss of volatile components, such as solvents, like e.g. organic solvents.

In general heat energy may be provided and/or transported e.g. by radiation, conduction, and/or convection. In the present disclosure, heat is supplied to a strip by absorption of radiation and transported along the strip by conduction of the strip. Heating a material such as a strip and/or heat-curable material, may result in an increase of the temperature of the material typically above room temperature, e.g. a temperature higher than 20 degrees Celsius. For effective curing a temperature of more than 80 degrees Celsius may be preferred, more preferably higher than 100 degrees Celsius, most preferably higher than 120 degrees Celsius or even higher, e.g. 200 degrees Celsius.

Curing may take place over an extended period of time, e.g. a curing time may comprise a period of several seconds up to minutes or longer, e.g. hours. A curing may depend on a total amount of heat energy supplied to a curing zone. For some applications, there may be an upper limit to a desired temperature, e.g. lower than a degradation temperature of the heat-curable material or other heat-sensitive components. Correspondingly there may be a minimum curing time for reaching a desired curing state. A curing state of the material may be cumulative, e.g. a material may be cured from a first state to a second state and subsequently from the second state to a third state. A curing rate of a material may depend on variables such as temperature, humidity, radiation, and/or applied pressure. A material may be considered cured when its properties have changed to perform a desired functionality e.g. adhering and/or conduction.

One example a heat-curable material may include an adhesive. A functionality of a heat-curable adhesive may be to bond adjacent surfaces together. Adhesives typically comprise a material that forms adhesive bonds with a surface contacting the material while it cures. The curing of an adhesive may comprise a hardening of the adhesive, e.g. from a liquid state into a solid state. The curing may also comprise an increase in viscosity of the adhesive. In one embodiment, an adhesive comprises a compound that cures by polymerization. Also other heat-curable adhesives may be used.

In a further embodiment the heat-curable material is a heat-curable electrically conductive adhesive, i.e. an adhesive that conducts electricity. Such an adhesive normally comprises or consists of one or more thermosetting resins, and electrically conductive particles. Suitable thermosetting resins may be selected from epoxy resins, benzoxazine resins, acrylate resins, bismaleimide resins, cyanate ester resins, polyisobutylene resins and/or combinations thereof. The electrically conductive particles may be selected from metal particles, metal plated particles or metal alloy particles and/or combinations thereof, wherein the electrically conductive particles preferably comprise or essentially consist of copper, silver, platinum, palladium, gold, tin, indium, aluminum or bismuth and/or combinations thereof. Electrically conductive particles essentially consisting of silver are particularly preferred. Desirably, the plated or coated metal combinations include silver coated copper, silver coated boron nitride, and/or silver coated aluminum. In an alternative embodiment the electrically conductive particles comprise or consist of carbon black, carbon fibers, graphite or metallic coated glass spheres, such as silver coated glass and/or combinations thereof. Preferably, the electrically conductive particles have a volume average particle size (D50) of about 3 µm to about 20 µm, more preferably of about 4 µm to about 15 µm. The electrically conductive particles can have different shapes, such as spherical and/or flake-like shapes.

In one embodiment, a heat-curable adhesive, such as a heat-curable electrically conductive adhesive is provided in a curing zone embedded between a component and a substrate. A component may e.g. comprise an electrical or optical component. The substrate may comprise any structure capable of carrying the component. The substrate may also comprise electrical or optical functionality. In one embodiment, the substrate may itself be an electrical or optical component, e.g. forming a stacked structure with adhesive therein between.

Another example of a heat-curable material may include a heat-curable electrically conductive ink, i.e. an ink that conducts electricity. Such an ink normally comprises or consists of one or more resins, electrically conductive particles, and one or more solvents. The electrically conductive particles correspond to the above described particles. Depending on the chemical nature of the resin component used in said ink, the heat-curable electrically conductive ink may be chemically curable and/or physically curable. Typically, the curing of an electrically conductive ink may comprise drying, e.g. evaporating a solvent. The solvent of the heat-curable electrically conductive ink may be an organic solvent which easily evaporates at low to moderate temperatures. Preferred organic solvents have a flash point below 200 degrees Celsius.

A functionality of a heat-curable electrically conductive ink may be to provide an electrical connection. The ink may be drawn or printed as a circuit on a variety of substrate materials such as polyester. It will be appreciated that while direct irradiation of a conductive ink may typically suffer from reflection of the radiation, a heat conducting strip may facilitate energy transfer into the ink in the form of conducted heat. In one embodiment, the heat-curable material comprises printed ink on a foil. In another embodiment, a heat-curable electrically conductive ink is provided as an electrical path in a curing zone embedded between substrates.

The heat-curable electrically conductive adhesive or heat-curable electrically conductive ink may further comprise one or more additives, such as curing agents, plasticizers, oils, stabilizers, antioxidants, anti-corrosion agents, chelating agents, pigments, dyestuffs, polymeric additives, defoamers, preservatives, thickeners, rheology modifiers, humectants, adhesion promoters, and dispersing agents.

Heat-curable material is provided in a curing zone. The curing zone may be embedded between obstructions, i.e. structures that obstruct access to the curing zone in particular obstructing direct access by electromagnetic radiation from an external energy source. The obstructions may e.g. block more than ninety percent of electromagnetic radiation from the external source. The curing zone may thus be effectively or practically inaccessible to electromagnetic radiation. In one embodiment electromagnetic radiation from a radiation source is blocked by an obstruction arranged between the radiation source and the embedded curing zone, e.g. an opaque component such as a chip. The heat-conducting strip may conduct heat generated by absorption of electromagnetic radiation towards the embedded curing zone. Curing of the heat-curable material may thus be facilitated by providing a heat conducting strip extending near a curing zone. The heat conducting strip is preferably in thermal contact with the heat-curable material for facilitating heat transfer. Alternatively, the strip may also be near the heat-curable material e.g. transmitting some or all of the heat in the embedded curing zone by radiation off the strip.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the size and relative sizes of systems, components, layers, and regions may be exaggerated for clarity. Embodiments are described with reference to cross-section illustrations that are schematic illustrations of possibly idealized embodiments and intermediate structures of the invention.

In the description, relative terms as well as derivatives thereof should be construed to refer to the orientation as then described or as shown in the drawing under discussion. These relative terms are for convenience of description and do not require that the system be constructed or operated in a particular orientation unless stated otherwise. It will further be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will further be understood that when a particular step of a method is referred to as subsequent to another step, it can directly follow said other step or one or more intermediate steps may be carried out before carrying out the particular step. Like numbers refer to like elements throughout.

Figure 1:
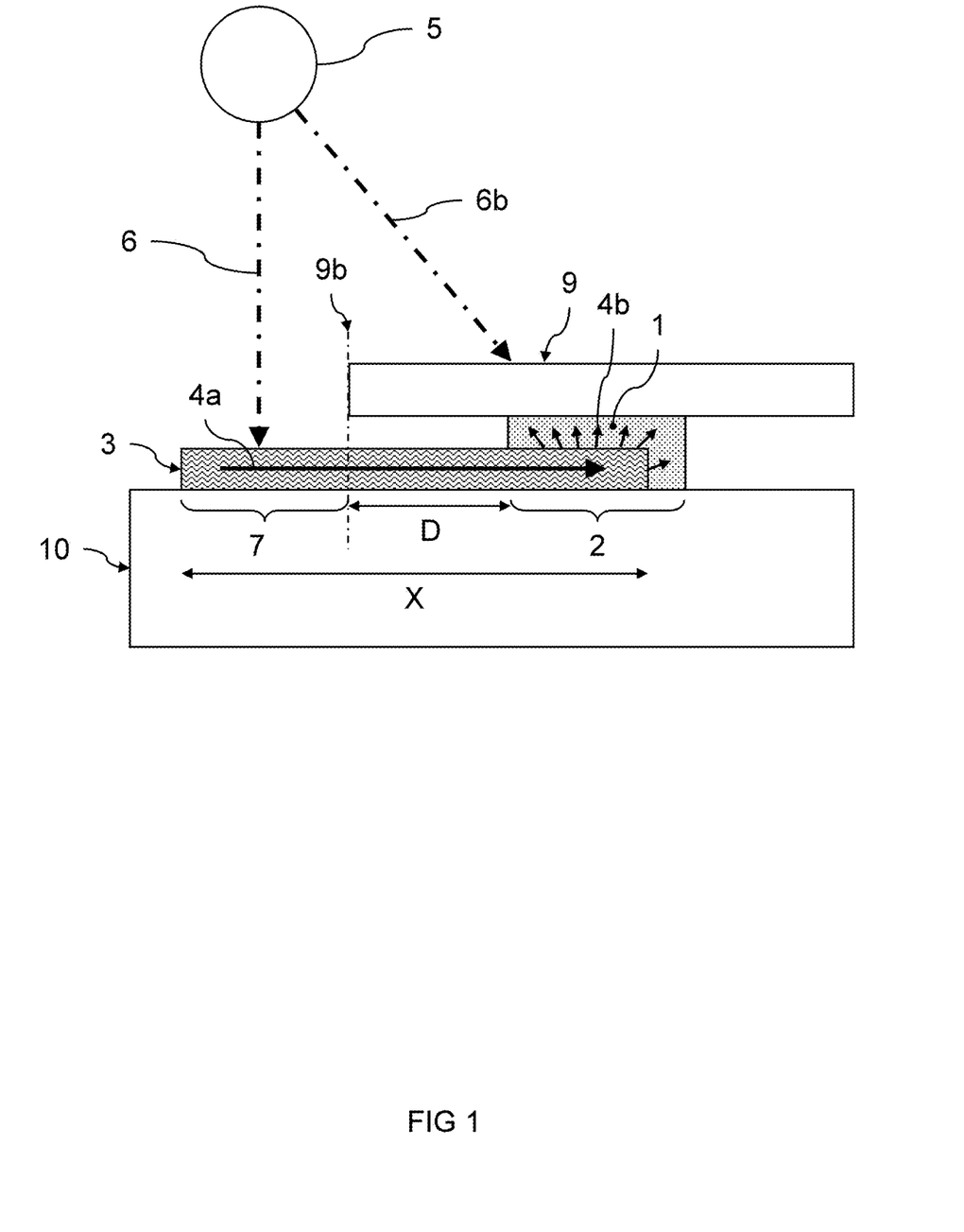
FIG. 1 shows a cross-sectional view of an embodiment illustrating a method for curing a heat-curable material in an embedded curing zone.

FIG. 1 shows a cross-sectional view of an embodiment illustrating a method for curing a heat-curable material 1 in an embedded curing zone 2.

The method comprises providing a heat-conducting strip 3 partially arranged between obstructions 9 and 10 that form the embedded curing zone 2 therein between. The heat-conducting strip 3 extends from the embedded curing zone 2 to a radiation-accessible zone 7 that is distanced from the embedded curing zone 2 and at least partially free of the obstructions 9 and 10. The term "at least partially free" is used to indicate that the strip is not blocked by the obstructions, in particular accessible to electromagnetic radiation, in the radiation-accessible zone 7.

The method further comprises irradiating the heat-conducting strip 3 in the radiation-accessible zone 7 by means of electromagnetic radiation 6. Due to the obstructions 9, 10 the embedded zone 2 is practically inaccessible to radiation 6b. Heat 4a generated by absorption of the electromagnetic radiation 6 in the heat-conducting strip 3 is conducted from the radiation-accessible zone 7 along a length X of the heat-conducting strip 3 through the heat conducting strip 3 over at least a distance D to the embedded curing zone 2 to cure the heat-curable material 1 by conducted heat 4b emanating from the heat-conducting strip 3 into the embedded curing zone 2.

In an embodiment, the heat-curable material 1 comprises a heat-curable adhesive in the embedded curing zone 2 formed between a substrate 10 and a component 9 on the substrate 10. Hence, in this embodiment the obstructions comprise the substrate and the component. The heat-conducting strip 3 is partially arranged between the component 9 and the substrate 10 and extends from the embedded curing zone 2 to the radiation-accessible zone beyond a boundary 9b of the component 9, e.g. a boundary when viewed from a perspective of the radiation source 5 looking at the heat-conducting strip 3. In the embodiment, the method comprises bonding the component 9 to the substrate 10 by curing the heat-curable adhesive 1 therein between.

Figure 2:
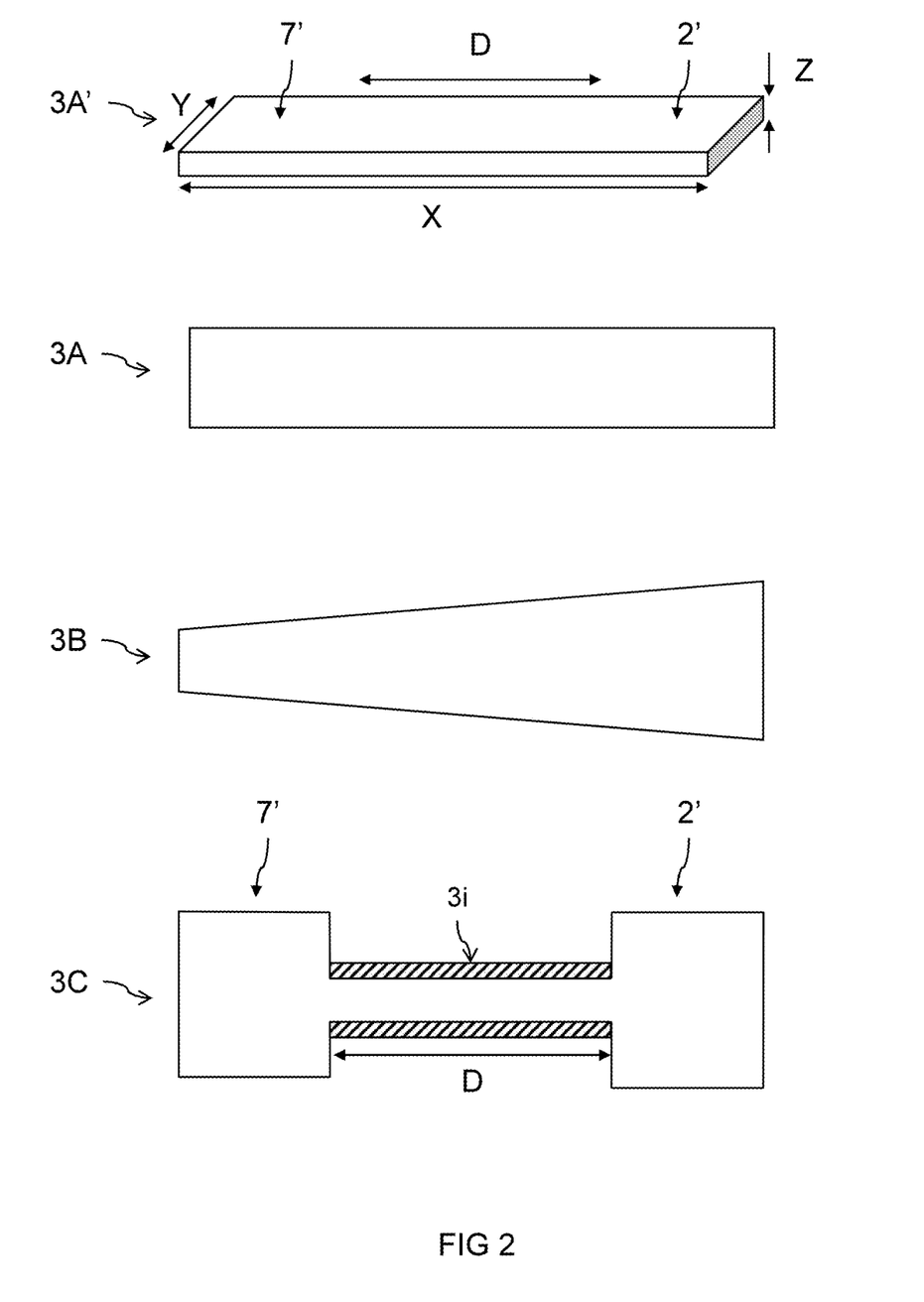
FIG. 2 shows one perspective view and three top views of embodiments of heat-conducting strips.

FIG. 2 shows top views of three embodiments of heat-conducting strips 3A, 3B, 3C. The perspective view 3A' of embodiment 3A shows that this embodiment comprises a flat strip of length X, width Y, and thickness Z. The strip comprises a first part 7' that will be positioned is use in radiation accessible zone and a second part 2' that will be positioned in use in an embedded curing zone. The parts 2' and 7' are distanced from each other by a distance D along the length X of the strip, over which length the heat may be conducted by the strip from the radiation-accessible zone to the embedded curing zone.

As shown in the top view of embodiment 3B of a heat-conducting strip, the width Y of the strip can vary. In the top view of embodiment 3C it is shown that the first part 7' of the strip may be wider e.g. having an advantage of providing a bigger target for electromagnetic radiation impinging the strip. It is also shown that the second part 2' of the embodiment 3C is wider, e.g. having an advantage of providing a larger surface in the embedded curing zone for emanating heat. These embodiments illustrate that a shape of the heat-conducting strip may vary.

In general, the heat-conducting strip may be a structure defining a heat-conducting path along a length dimension X of the strip between a radiation-accessible zone and an embedded curing zone. The strip typically comprises a thin structure having a width Y that is much smaller than its length X, e.g. by a factor of three or more, typically by a factor five or more. An advantage of a narrow strip may be that a heat capacity of the strip is kept relatively low and accumulated heat may be more readily distributed along a length X of the strip between the radiation-accessible zone and embedded curing zone rather than along the width Y. The strip may typically comprises a flat structure, e.g. the width Y of the strip may be larger than its thickness Z, e.g. by a factor three or more. An advantage of a flat strip may be that a larger area is obtained, e.g. for receiving irradiation in the radiation-accessible zone and/or for distributing heat energy in the embedded curing zone. Alternatively, a thickness and width of the strip may be approximately the same, e.g. the strip may be shaped as a wire. In the embodiment 3C, the strip may comprise wider sections 7' and 2' connected by a wire shaped middle part.

Dimensions of the heat-conducting strip may depend on the application where it is used. Typically a length X of the strip may vary between a few hundred micrometres up to several centimetres. The length X may be mainly determined by a distance D between an embedded curing zone and a radiation-accessible zone. Typically a width Y of the strip may vary between a resolution of a deposition tool, e.g. printer, from a few micrometre up to a few millimetres. The width Y may also be determined by a resolution of the pattern irradiating the strip with electromagnetic radiation for heating the strip, and/or determined by a desired heat capacity or heat transport efficiency. Typically a thickness Z of the strip is determined by the amount of material deposited, e.g. in a printing process a few micrometres up to a millimetre or more. A minimum thickness may be determined by a desire for reliable heat transport. Also other dimensions are possible. The strip may be deposited using a deposition tool such as a printer. The strip may also result from a lithographic process. Also other means for providing a strip are possible, e.g. the strip may comprise a pre-manufactured strip of material that is placed between an embedded curing zone and a radiation-accessible zone.

The heat-conducting strip is arranged for conducting heat along a length X of strip, wherein the length refers to the longest dimension of the strip. This is in contrast to heat conduction through a width Y or thickness Z of the strip which typically does not involve transporting the heat over any significant distance. In one embodiment, the embedded curing zone is distanced from the radiation-accessible zone by more than a centimetre as measured along a heat-conducting path length D of the heat-conducting strip.

The strip may comprise a bent or curved structure wherein the heat-conduction path follows the bends or curves of the structure. The strip may also comprise multiple heat-conduction paths, e.g. splitting up the strip. In one embodiment, the strip may be electrically isolated from a component or its circuitry which may also prevent passing heat on to the component, e.g. when the component is heat sensitive. Alternatively, a circuit wire, e.g. of the component, may be used as heat-conducting strip. This may have an advantage that no additional strip is required. In one embodiment, a circuit wire may arranged and adapted to perform a function of a heat conducting strip. For example, the circuit wire may extend between a radiation-accessible zone and an embedded curing zone.

A strip may be considered heat-conducting when it has a relatively high thermal conductivity. In one embodiment, the thermal conductivity of the heat-conducting strip is more than 100 Watt per meter per Kelvin, preferably more than 150 Watt per meter per Kelvin, most preferably more than 200 Watt per meter per Kelvin, e.g. measured along a length of the strip. For some applications also a lower thermal conductivity may be sufficient, e.g. preferably higher than 10 Watt per meter per Kelvin Thermal conductance may refer to a quantity of heat that passes in unit time through a strip of particular length X and area cross-section (e.g. width Y times thickness Z) when opposite sides of the strip along its length X differ by a unit temperature. The thermal conductance is typically proportional to the thermal conductivity and cross-section area of the strip and inversely proportional to a distance D between the radiation-accessible zone 7 and embedded curing zone 2. Typically, the higher the thermal conductivity, the faster may be the energy transfer from the radiation-accessible zone to the embedded curing zone. This may facilitate more energy being transported and deposited in the embedded curing zone instead of being trapped in the radiation-accessible zone.

Alternatively or in addition it may be advantageous to provide a heat-conducting strip having a relatively low heat capacity or specific heat. Typically, for a lower specific heat, energy deposited in the heat-conducting strip is less used for heating the strip itself and more heat may be passed e.g. to the embedded curing zone.

Alternatively or in addition it may be advantageous to minimize heat leaking away along a path D between the radiation-accessible zone and the embedded curing zone. One solution may be to minimize a ratio of an outer surface and a cross-section area of the heat-conducting strip at least along the path D. A smallest ratio may typically correspond to a heat-conducting strip having a circular cross-section, i.e. a rod or wire shape. Alternatively or in addition, in an embodiment (e.g. shown for 3C) a path D of the heat-conducting strip between the radiation-accessible zone and the embedded curing zone is provided with heat-insulation means 3i, arranged for preventing heat from emanating out of the heat-conducting strip along the said path. This is advantageous in that heat is more efficiently transported between the radiation-accessible zone and the embedded curing zone instead of getting partially lost along the path D. In an embodiment, the heat-insulation means 3i may be provided as an enclosure around part of the heat-conducting strip. In another embodiment, the heat-insulation means 3i may be provided as a heat-insulating layer above and/or below a heat-conducting strip.

In one embodiment, the strip comprises or consists of a heat-conducting metal. Examples may include a strip comprising or consisting of aluminium, gold, copper, or silver. Such a strip may have an advantage of providing a relatively high thermal conductivity, e.g. higher than 100 Watt per meter per Kelvin. In one embodiment, the strip may comprise metallic or already cured printed ink. Such a strip may have an advantage that it can be easily applied using a printer while still having acceptable heat conductivity, e.g. higher than 10 Watt per meter per Kelvin. In a further embodiment, the ink may be cured progressively by conducted heat originating from a radiation-accessible zone along a track of the ink. In another embodiment, the strip comprises aluminium nitride. This material may provide an advantage of a relative high thermal conductivity while also being relatively electrically insulating, e.g. providing less risk of short circuits.

Energy is preferably provided to the strip by absorption of electromagnetic radiation in a radiation-accessible zone. The electromagnetic radiation may e.g. be in a visible, ultraviolet, or infrared wavelength range. The strip typically comprises a sufficiently high absorption coefficient in a range of the electromagnetic radiation, e.g. absorbing at least fifty percent of radiation impinging the strip, preferably more. The strip is preferably at least partly accessible to the electromagnetic radiation, e.g. at least fifty percent of radiation impinging an assembly comprising the strip can directly reach the strip. Preferably, the strip is at least partly exposed to the radiation. In an embodiment, the radiation-accessible zone is irradiated through a transparent structure enclosing the heat-conducting strip, i.e. at least partly transparent to the electromagnetic radiation. This may still provide an advantage that the embedded curing zone does not need to be directly accessible to the electromagnetic radiation.

Preferably energy is provided to the strip as directional electromagnetic radiation from a specific radiation source. Directional electromagnetic radiation may be obtained by using a directional source, e.g. laser and/or by directing and shaping radiation using optical components such as lenses, mirrors and/or apertures. This is contrasted to non-directional heat, e.g. in an oven, wherein the heat is more homogeneously and/or indiscriminately impinging an assembly. Preferably, a pattern of the electromagnetic radiation can be controlled to irradiate a specific area, in particular, the strip in the radiation-accessible zone. In one embodiment, a light source of the electromagnetic radiation may comprise a lamp or laser. For example a laser may be directed to dominantly irradiate the strip while avoiding irradiating a heat sensitive component near the strip. In one embodiment, the electromagnetic radiation substantially exclusively impinges one or more heat conducting strips, e.g. more than eighty percent of incoming electromagnetic radiation impinges the strips. In one embodiment, a mask is arranged in a light path of the electromagnetic radiation to shape a pattern projected by the light source onto the one or more strips.

Figure 3:
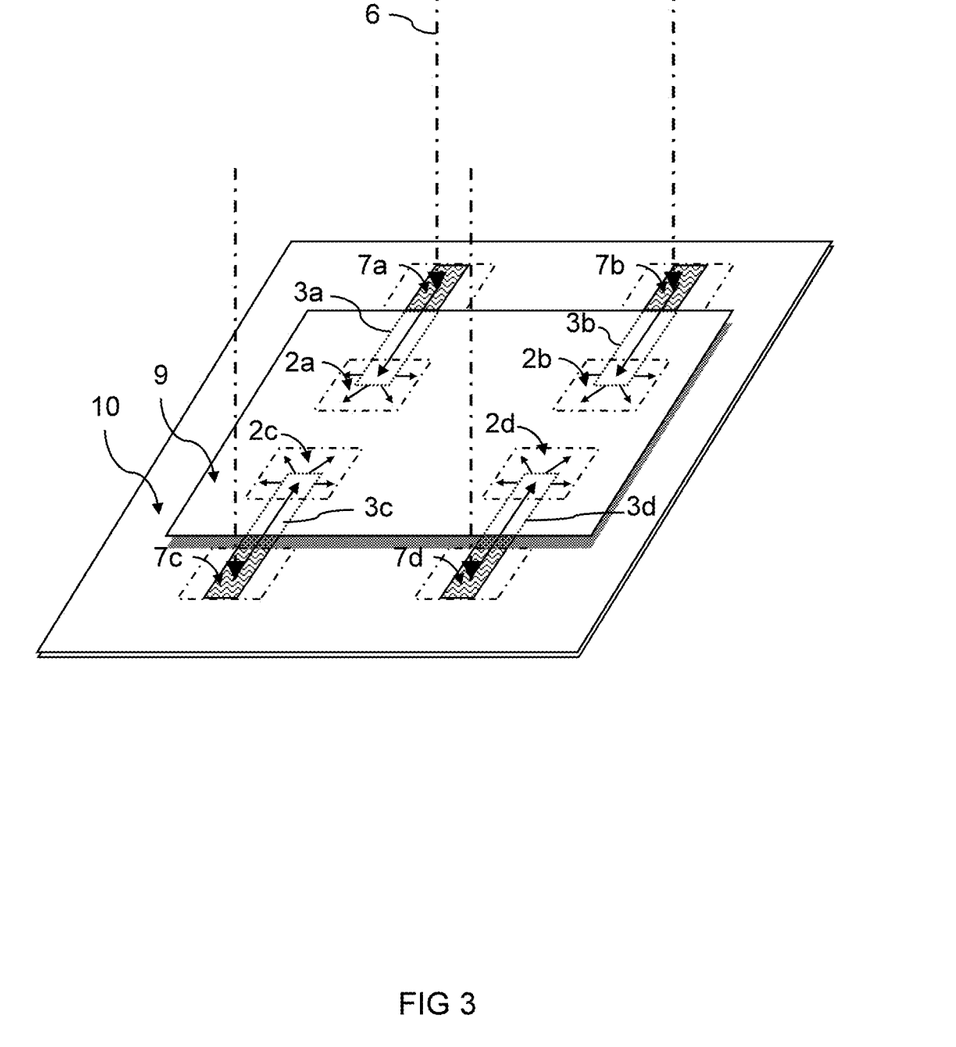
FIG. 3 shows a perspective view of an embodiment illustrating a method for curing a heat-curable material in multiple embedded curing zones.

FIG. 3 shows a perspective view of an embodiment illustrating a method for curing a heat-curable material in multiple embedded curing zones. In the shown embodiment, the curing zones are formed between a substrate 10 and a component 9 on the substrate. In the shown embodiment a plurality of heat-conducting strips 3a, 3b, 3c, 3d are provided extending between a plurality of radiation-accessible zones 7a, 7b, 7c, 7d and a respective plurality of embedded curing zones 2a, 2b, 2c, 2d. While the heat-conducting strips 3a, 3b, 3c, 3d are shown as separate strips, the strips may also be interconnected e.g. forming a single strip with multiple branches.

In an embodiment, a mask (not shown) is arranged in a light path of the electromagnetic radiation 6 for selectively directing the electromagnetic radiation 6 at the plurality of radiation-accessible zones 7a, 7b, 7c, 7d. Alternatively, the electromagnetic radiation 6 may comprise separate beams, e.g. generated by a laser. The beams may impinge the plurality of radiation-accessible zones 7a, 7b, 7c, 7d simultaneously, consecutively, or a combination, e.g. first irradiating zones 7a and 7b, and then irradiating zones 7c and 7c.

Figure 4A:
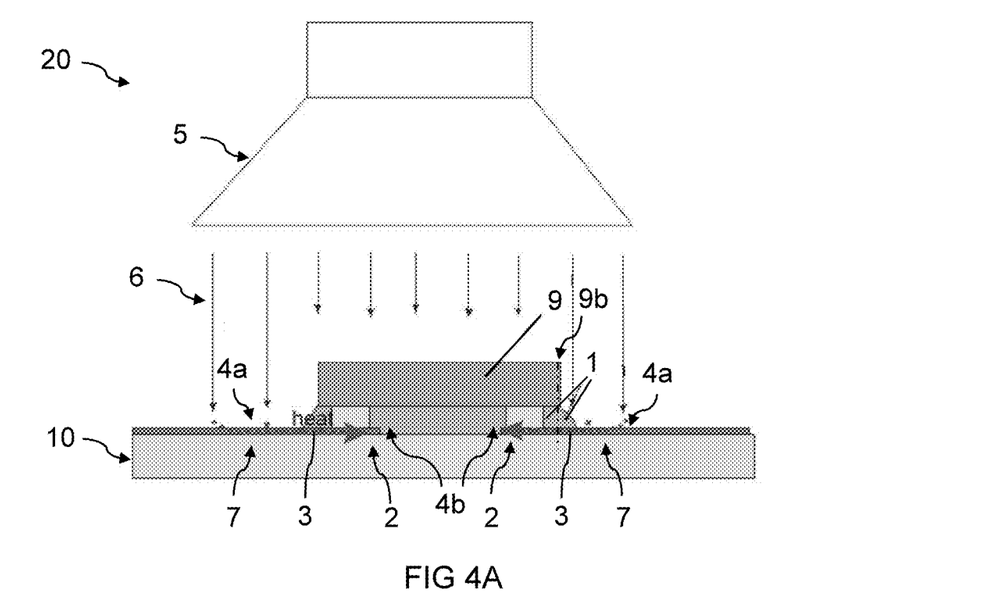
FIG. 4A shows a side view of an embodiment illustrating a method for curing a heat-curable material in an embedded curing zone between a component and a substrate.

FIG. 4A shows a side view of an embodiment illustrating a method for using a curing system 20. The curing system 20 comprises a radiation source 5. The method comprises providing the system 20 with a substrate 10 comprising a heat-conducting strip 3 partially arranged between the substrate 10 and a component 9 on the substrate 10. The component 9 and substrate 10 form an embedded curing zone 2 therein between. The heat-conducting strip 3 extends from the embedded curing zone 2 to a radiation-accessible zone 7 that is distanced from the embedded curing zone 2 and at least partially free of the component 9 or substrate 10. The method further comprises controlling the curing system 20 for irradiating the heat-conducting strip 3 in the radiation-accessible zone 7 by means of electromagnetic radiation 6 emanating from the radiation source 5. Heat 4a generated by absorption of the electromagnetic radiation 6 in the heat-conducting strip 3 is conducted from the radiation-accessible zone 7 along a length of the heat-conducting strip 3 to the embedded curing zone 2 to cure the heat-curable material 1 by conducted heat 4b emanating from the heat-conducting strip 3 into the embedded curing zone 2.

In an embodiment, the radiation source 5 is further used in a lithographic step for exposing a circuit pattern comprised on the component 9 and/or substrate 10. In one embodiment, a first mask is provided comprising the circuit patterns and a second mask is provided comprising an illumination pattern corresponding to one or more radiation-accessible zones 7 of one or more heat-conducting strips 3.

In the shown embodiment, not all heat-curable material 1 is embedded between the obstructions 9 and 10, e.g. some of the heat-curable material 1 is extending beyond a boundary 9b of the component 9. Also this heat-curable material 1 may be heated via the heat-conducting strip 3. In one embodiment, the heat-conducting strip 3 has a higher absorption coefficient to the electromagnetic radiation 6 than the heat-curable material 1. The heat-conducting strip 3 may thus be more efficient in absorbing the electromagnetic radiation 6 than the heat-curable material 1. The heat-curable material 1 may be predominantly heated via the heat-conducting strip 3 rather than as a result of direct absorption of electromagnetic radiation 6. It will be appreciated that the process can also be applied to cure adhesives or other heat-curable materials which do not absorb light.

In the shown embodiment, electromagnetic radiation 6 impinges not only the heat-conducting strip 3 but also the component 9. Due to the presence of the heat conducting strip 3, heat may be more efficiently transported to the embedded curing zone 2 than via the component 9. This means that component 9 can be heated less. In an embodiment (shown e.g. in FIG. 5), a radiation shield may be placed to cover the component 9 against the electromagnetic radiation 6. Alternatively or in addition, the electromagnetic radiation 6 may be shaped by a mask (not shown) or other optics between the radiation source 5 and the component 9 and substrate for selectively transmitting and/or directing the electromagnetic radiation 6 to the radiation-accessible zone 7 of the heat-conducting strip 3.

Figure 4B:
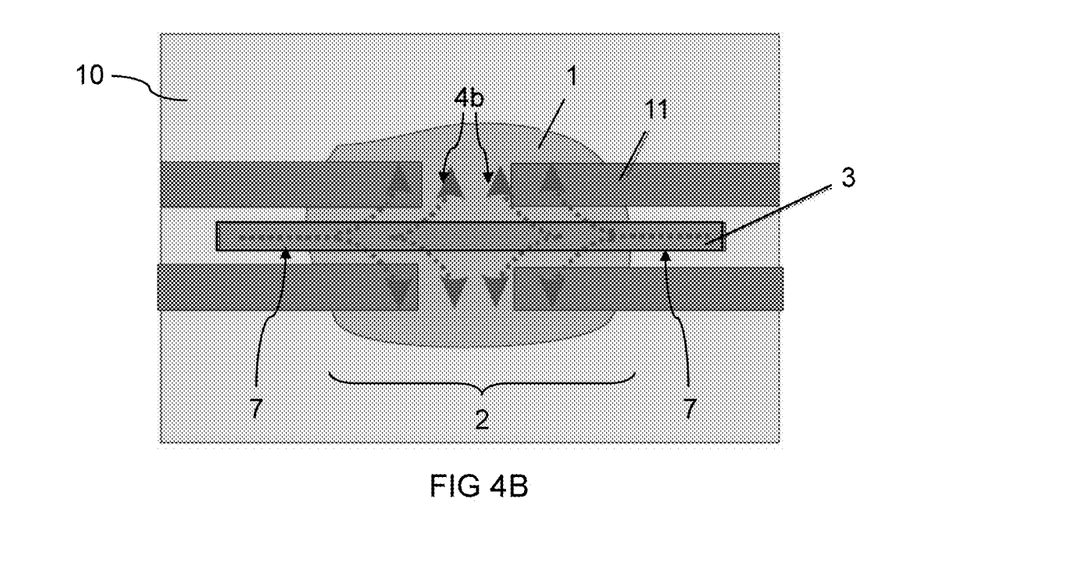
FIG. 4B shows a bottom view of the embodiment of FIG. 4A through the substrate.

FIG. 4B shows a bottom view of the embodiment of FIG. 4A through the substrate 10. As shown the heat-conducting strip 3 is provided between circuit parts 11, in this case wiring for electrically connecting the component. In this embodiment the heat-conducting strip 3 is of one part extending between a central embedded curing zone 2 and two radiation-accessible zones 7. Alternatively or in addition to the dedicated heat-conducting strip 3, the circuit parts 11 may also facilitate heat transfer from the radiation-accessible zone 7 to the embedded curing zone 2. Advantageously circuit parts 11 do not comprise active components such as transistors which may damage due to overheating. This thus differs e.g. from a method using the component itself for transporting heat to the embedded curing zone 2.

Preferably, at least fifty percent, more preferably at least ninety percent of an accumulated energy used for curing the heat-curable material 1 in the embedded curing zone 2 is provided via a heat-conducting strip 3, either dedicated for the task and/or comprised in passive circuitry such as electrical connection wires or tracks. For an embodiment using electrical connection wires as heat conducting strip, it will be appreciated that electricity conducting wires may also provide beneficial heat-conducting properties. Furthermore, it will be appreciated that a component is typically adhered to a substrate by forming adhesive connections near electrical connections which may be positioned under a chip, i.e. in an embedded curing zone between the component and a substrate.

Figure 5:
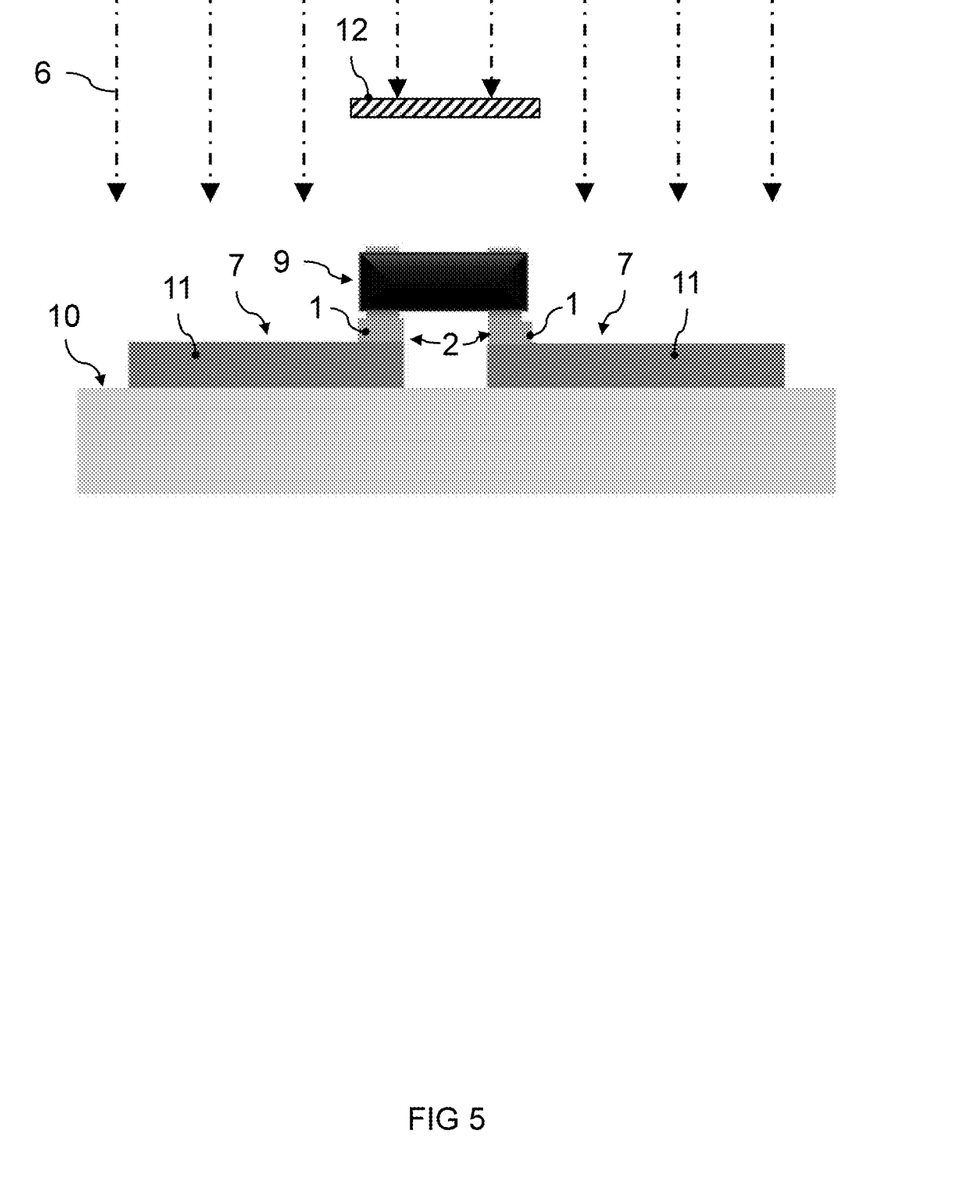
FIG. 5 shows a side view of an embodiment illustrating a method for curing a heat-curable material in an embedded curing zone between a component and an electric pathway on a substrate.

FIG. 5 shows a side view of an embodiment illustrating a method for curing a heat-curable material 1 in an embedded curing zone 2 between a component 9 and an electric pathway 11 on a substrate 10. Electromagnetic radiation 6 impinging the electric pathway 11 in the radiation-accessible zone 7 may travel to the heat-curable material 1 in the embedded curing zone 2 to cure the heat-curable material 1 by heat emanating from the electric pathway 11 in the embedded curing zone 2. The electric pathway 11 may thus function as a heat-conducting strip.

In an embodiment, the heat-curable material 1 is electrically conducting and arranged in a path of the electrical circuit formed between the electric pathway 11 and component 9. In this way, the heat-curable material 1 may become part of the electric pathway 11 while also providing a bonding between the component 9 and substrate 10.

In an embodiment the electromagnetic radiation 6 is selectively blocked by a mask 12 to transmit the electromagnetic radiation 6 predominantly in the radiation-accessible zones 7 of the heat-conducting strip 3 and avoid the component 9 and/or other parts of the substrate. This may prevent undesired degradation of radiation and/or heat sensitive components.

Figure 6A:
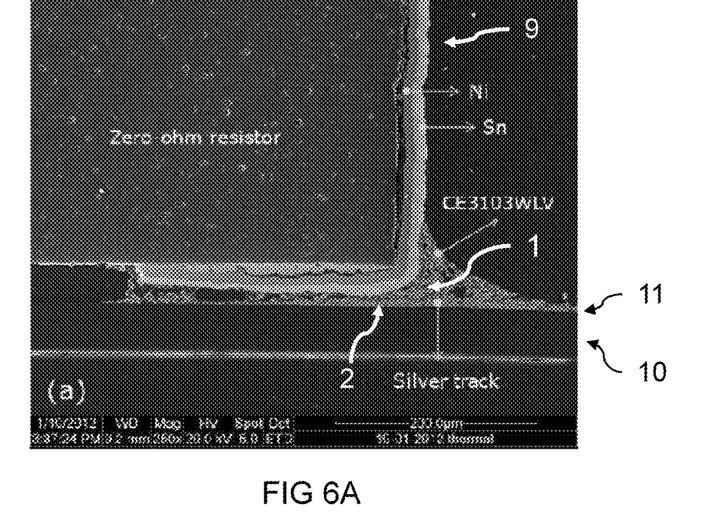
FIG. 6A shows a microscope image of a heat-curable material in an embedded curing zone that was cured in an oven.

FIG. 6A shows a microscope image of an assembly comprising a substrate 10 and a component 9 adhered to the substrate 10 by means of a heat-curable material 1 formed in an embedded curing zone 2 between the component 9 and the substrate 10. In this assembly the heat-curable material 1 was cured by placing the assembly in an oven for ten minutes at 120 degrees Celsius.

The component 9, substrate 10, and electric pathway 11 may have a similar arrangement as shown in FIG. 5. The shown component comprises a zero-ohm resistor for testing purposes of the adhesive bond. The shown electrical pathway 11 comprises a silver track deposited on the substrate using screen printing. The shown substrate 10 comprises a polyethylene terephthalate (PET) foil. The shown heat-curable material 1 comprises an electrically conductive epoxy adhesive known as "Hysol ECCOBOND CE3103WLV" obtainable from Henkel Corporation.

Figure 6B:
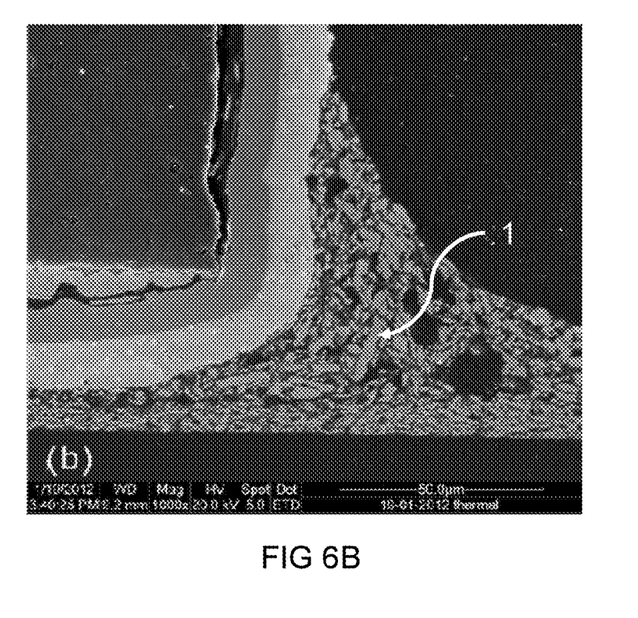
FIG. 6B shows an enlarged view of the image of FIG. 6A.

FIG. 6B shows an enlarged view of the image of FIG. 6A as indicated by the scale. It may be noticed that the heat-cured material 1 still comprises a granular structure.

Figure 7A:
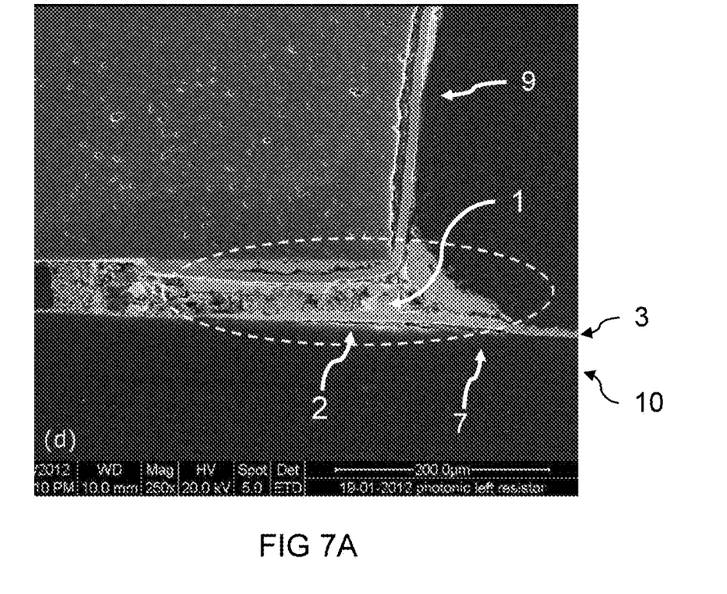
FIG. 7A shows a microscope image of a heat-curable material in an embedded curing zone that was cured by irradiating a heat-conducting strip.

FIG. 7A shows a microscope image similar to that of FIG. 6A except that the heat-curable material 1 was cured by irradiating heat-conducting strip 3 for only seven seconds. In this time a total radiation dose of approximately 0.1 Joule was provided by a photonic set-up in which electromagnetic radiation in the visible range, emanating from a focused light source is used to illuminate the strip at the radiation-accessible zone 7.

In an embodiment, a photonic setup as described in EP2349727 is used for irradiating the heat-conducting strip 3. In particular such a setup comprises a device for curing patterns of a substance at a surface of a foil comprising a carrier facility for carrying the foil within an object plane, a photon radiation source arranged at a first side of the object plane for emitting photon radiation in a wavelength range for which the foil is transparent, a first and a second concave reflective surface arranged at mutually opposite sides of the object plane, for mapping photon radiation emitted by the photon radiation source into the object plane, the photon radiation source being arranged between the first concave reflecting surface and the object-plane. In a further embodiment, the photon radiation source is a tubular radiator with a length-axis and the first and the second reflecting surfaces are cylindrical surfaces extending along the length axis. In one embodiment the tubular radiator comprised a xenon flash lamp.

Also alternative setups may be used, e.g. a laser beam comprising the electromagnetic radiation is selectively directed at the heat-conducting strip in the radiation-accessible zone. The electromagnetic radiation can also be selectively directed by other means, e.g. a mask. By selectively directing the electromagnetic radiation to the heat-conducting strip, it can be prevented that other (e.g. heat sensitive) components are irradiated. Accordingly, in one embodiment, radiation is directed to the radiation zone and not to the curing zone (i.e. to the location on the substrate/component where the curing zone is located).

As shown, the heat-conducting strip 3 (in this case also a conductive track) is partially arranged between the substrate 10 and component 9. The heat-conducting strip 3 extends from the embedded curing zone 2 to a radiation-accessible zone 7 that is distanced from the embedded curing zone 2 and at least partially free of the substrate 10 or component 9. The heat-curable material 1 is cured by conducted heat received in the radiation-accessible zone 7, conducted by the heat-conducting strip 3, and emanated from the heat-conducting strip 3 into the embedded curing zone 2.

Figure 7B:
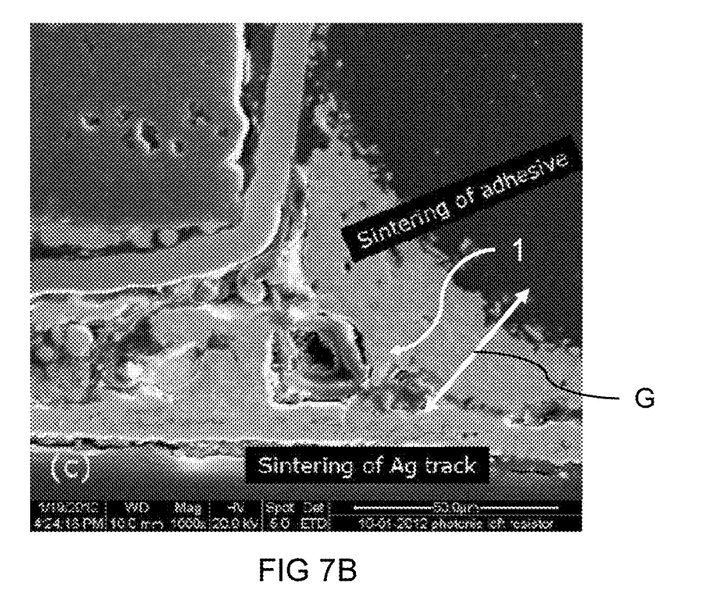
FIG. 7B shows an enlarged view of the image of FIG. 7A.

FIG. 7B shows an enlarged view of the image of FIG. 7A. When compared to the oven-cured sample of FIG. 6B, it may be noticed that the heat-cured material 1 comprises much less of a granular structure. This may be due to sintering of the heat-curable material 1. Also the silver track that acts as the heat-conducting strip 3 shows signs of sintering. The sintering may be indicative of high temperatures and/or energy release that was experienced around the heat-conducting strip 3. As a result of heat emanating from the heat-conducting strip 3, the heat-curable material 1 is shown to comprise a curing gradient G wherein the heat-curable material 1 is less cured for distances further away from the heat-conducting strip 3. This may be one difference compared to an oven cured assembly.

Despite the large difference in curing time, approximately the same interconnect resistance and adhesion strength were obtained for the oven cured assembly of FIGS. 6A, 6B and the "photonically" cured assembly of FIGS. 7A, 7B. Other interesting features can also be observed in the cross section pictures: the photonically cured samples show sintering of the Ag (silver) particles in the conductive adhesives and also they show some melting of the Sn (tin) finish on the components. This indicates a temperature of 240 degrees Celsius was reached which was confirmed by thermocouple measurements. Also sintering of the conductive traces is observed underneath the component. Sintering of the adhesive particles and melting of Sn was also obtained for Cu circuitry. The fact that the curing gradient comprises sintered material adjacent the heat-conducting strip 3 may be a further difference between traditional oven cured assemblies and photonically cured assemblies.

The influence of the presence of the conductive traces was checked and it was found that a component bonded to a foil without conductive traces did not lead to sintering of the adhesive. It is noted that while in the present example, no extra thermally conducting features needed to be supplied, this may become more desired especially for bigger components and/or when a distance between an embedded curing zone 2 and a radiation-accessible zone 7 becomes larger.

Figure 8:
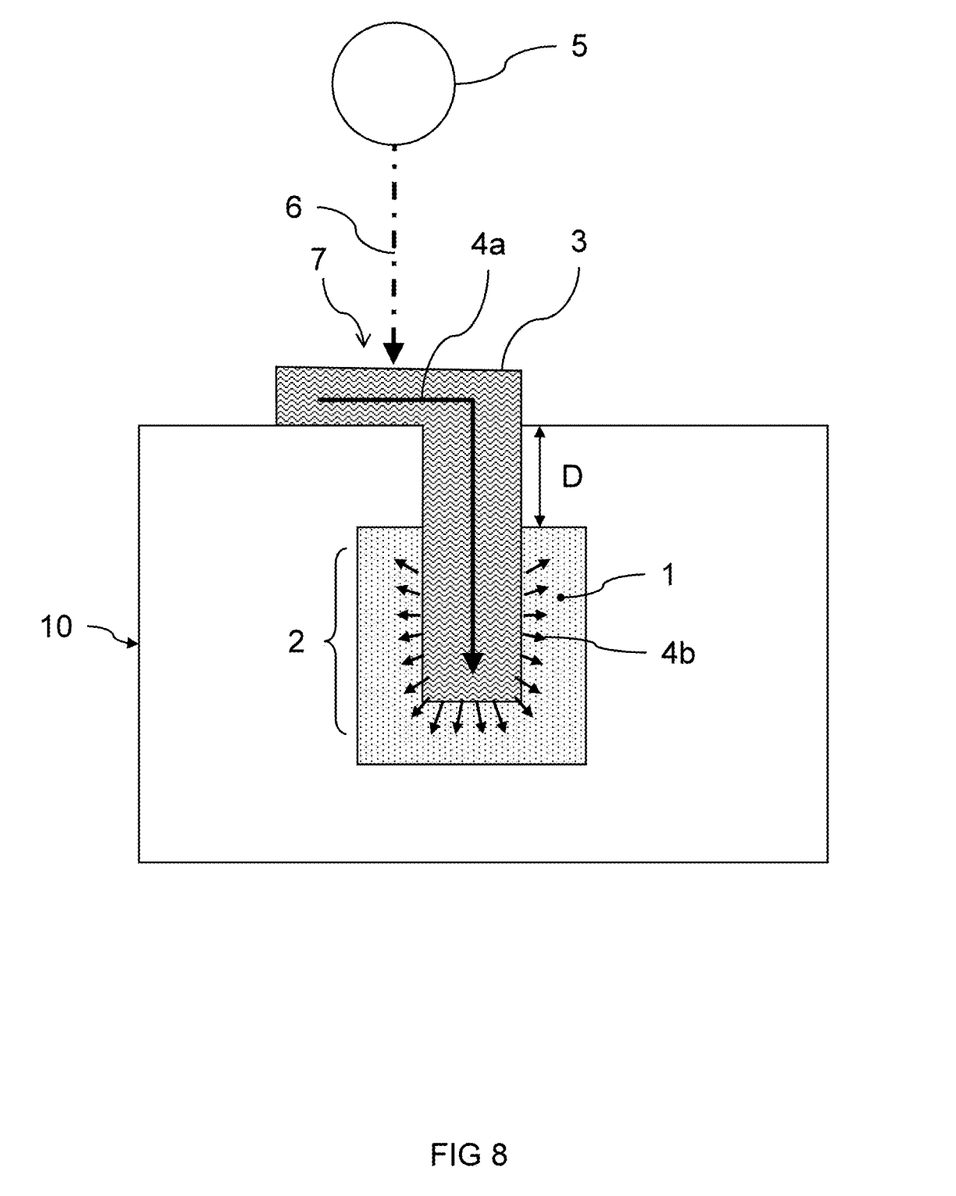
FIG. 8 shows a cross-sectional view of another embodiment illustrating a method for curing a heat-curable material in an embedded curing zone.

FIG. 8 shows a cross-sectional view of another embodiment illustrating a method for curing a heat-curable material 1 in an embedded curing zone 2. In the embodiment, the heat-conducting strip 3 is bent comprising a horizontal part and a vertical part. The embedded curing zone 2 is enclosed by the substrate 10, e.g. buried beneath its surface separating the embedded curing zone 2 from a radiation-accessible zone 7 by a distance D. For example, the substrate 10 may block direct illumination of the embedded curing zone 2 by electromagnetic radiation 6 from radiation source 5. Instead, heat 4a generated by absorption of the electromagnetic radiation 6 at the radiation-accessible zone 7 is conducted by the heat-conducting strip 3 over the distance D along a length of the heat-conducting strip 3 towards the embedded curing zone 2 to cure the heat-curable material 1 by conducted heat 4b emanated from the heat-conducting strip 3 in the embedded curing zone 2.

Some of the shown embodiments employ a thermally conductive (metallic or already cured printed ink) strip which leads from outside to underneath a component. This strip absorbs light generated by the "photonic technology", e.g. a lamp or laser, converts it into heat and transfers the heat to underneath the component. The heat is there trapped between the component and the circuitry, which may lead to an efficient curing process. When the substrate is heated by "photonic technology", the strip may rapidly increase in temperature. This heat is lead to underneath the component by the thermally conductive strip which in turn cures the adhesive. In some embodiments also the conductive circuitry can be used for this purpose, which circuitry may anyway lead to underneath the chip. An extra strip may then be superfluous. If the substrate is transparent, it is possible to also provide photonic energy from the bottom. Lateral heat conduction is then not so important but the efficient conversion of light into heat may make the curing process more effective. The process can then also be applied to cure adhesives which do not absorb light While example embodiments were shown for heat-curing materials in an embedded curing zone, also alternative ways may be envisaged by those skilled in the art having the benefit of the present disclosure for achieving a similar function and result. E.g. the heat-conducting strip may be substituted for one or more alternative components providing heat conduction. Instead of electromagnetic radiation also other types of radiation may be used to similar effect for heating the strip. The various elements of the embodiments as discussed and shown offer certain advantages, such as efficiently transferring heat to an otherwise inaccessible zone. Of course, it is to be appreciated that any one of the above embodiments or processes may be combined with one or more other embodiments or processes to provide even further improvements in finding and matching designs and advantages. It is appreciated that this disclosure offers particular advantages to curing adhesives and conductive inks, and in general can be applied for any application wherein it is desired to efficiently supply heat to a radiation-inaccessible zone.

Finally, the above-discussion is intended to be merely illustrative of the present system and should not be construed as limiting the appended claims to any particular embodiment or group of embodiments. Thus, while the present system has been described in particular detail with reference to specific exemplary embodiments thereof, it should also be appreciated that numerous modifications and alternative embodiments may be devised by those having ordinary skill in the art without departing from the scope of the present systems and methods as set forth in the claims that follow. The specification and drawings are accordingly to be regarded in an illustrative manner and are not intended to limit the scope of the appended claims.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage.

The invention claimed is:

1. Method for curing heat-curable material in a plurality of embedded curing zones, the method comprising
providing a plurality of heat-conducting strips partially arranged between obstructions that form the respective embedded curing zones with the heat cure-able material therein between, the heat-conducting strips extending from the embedded curing zones to a plurality of radiation-accessible zones that are distanced from the respective embedded curing zones and at least partially free of the obstructions;
irradiating the heat-conducting strips in the radiation-accessible zones by means of electromagnetic radiation; wherein a mask is arranged in a light path of the electromagnetic radiation for selectively directing the electromagnetic radiation at the plurality of radiation-accessible zones; wherein heat generated by absorption of the electromagnetic radiation in the heat-conducting strips are conducted from the radiation-accessible zones along a respective length of the heat-conducting strips to the embedded curing zones to cure the heat-curable material by conducted heat emanating from the heat-conducting strips into the embedded curing zones, wherein at least fifty percent of an accumulated energy used for curing the heat-curable material in the embedded curing zones is provided via heat-conducting strips.

2. Method according to claim 1 wherein the heat-curable material comprises a heat-curable adhesive in the embedded curing zones formed between a substrate and at least one component on the substrate; wherein the heat-conducting strips are partially arranged between the at least one component and the substrate and extending from the embedded curing zones to the radiation-accessible zones beyond a boundary of the at least one component; wherein the method comprises bonding the at least one component to the substrate by curing the heat-curable adhesive therein between.

3. Method according to claim 2 wherein the heat-conducting strips are electrically isolated from the at least one component or its circuitry.

4. Method according to claim 1 wherein the heat-conducting strips comprise printed ink.

5. Method according to claim 4 wherein the heat-conducting strips have a thermal conductivity higher than 10 Watt per meter per Kelvin.

6. Method according to claim 1 wherein the electromagnetic radiation is selectively directed at the heat-conducting strips in the radiation-accessible zones.

7. Method according to claim 1 wherein the heat-conducting strips have a higher absorption coefficient to the electromagnetic radiation than the heat-curable material.

8. Method according to claim 1 wherein the heat-curable material is electrically conducting and arranged in a path of an electrical circuit.

9. Method according to claim 1 wherein the radiation-accessible zones are irradiated through a transparent structure enclosing the heat-conducting strip.

10. Method according to claim 1 wherein the heat-conducting strips comprise or consist of a heat conducting metal.

11. Method according to claim 1 wherein the heat-conducting strips have a thermal conductivity higher than 100 Watt per meter per Kelvin.

12. Method according to claim 1 wherein the embedded curing zones are distanced from the radiation-accessible zones by more than 1 centimetre as measured along a heat-conducting path length of the heat-conducting strips.

13. Method according to claim 1 wherein the radiation source for irradiating the heat-conducting strips is further used in a lithographic step for exposing a circuit pattern comprised on the component and/or substrate.

* * * * *

UNITED STATES PATENT AND TRADEMARK OFFICE
CERTIFICATE OF CORRECTION

PATENT NO. : 10,717,236 B2
APPLICATION NO. : 14/650084
DATED : July 21, 2020
INVENTOR(S) : van den Brand et al.

Page 1 of 1

It is certified that error appears in the above-identified patent and that said Letters Patent is hereby corrected as shown below:

On the Title Page

Item (73) Assignee, now reads:
NEDERLANDSE ORGANISATIE
VOOR TOEGEPAST-
NATUURWETENSCHAPPELIJK
ONDERZOEK TNO, 's-Gravenhage (NL)

Should read:
--NEDERLANDSE ORGANISATIE
VOOR TOEGEPAST-
NATUURWETENSCHAPPELIJK
ONDERZOEK TNO, 's-Gravenhage (NL)
HENKEL AG & CO. KGAA, Dusseldorf (DE)--

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*